US011249378B2

(12) United States Patent
Chen et al.

(10) Patent No.: US 11,249,378 B2
(45) Date of Patent: Feb. 15, 2022

(54) OPTICAL ENGINE MODULE

(71) Applicant: Coretronic Corporation, Hsin-Chu (TW)

(72) Inventors: Sung-Lien Chen, Hsin-Chu (TW); Ming-Chen Liu, Hsin-Chu (TW); Tsan-Fu Tseng, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 211 days.

(21) Appl. No.: 16/675,190

(22) Filed: Nov. 5, 2019

(65) Prior Publication Data

US 2020/0159097 A1 May 21, 2020

(30) Foreign Application Priority Data

Nov. 16, 2018 (CN) .......................... 201811364063.X

(51) Int. Cl.
*G03B 21/16* (2006.01)
*G03B 21/14* (2006.01)
(Continued)

(52) U.S. Cl.
CPC ........... *G03B 21/16* (2013.01); *G03B 21/005* (2013.01); *G03B 21/145* (2013.01); *H05K 7/2049* (2013.01)

(58) Field of Classification Search
CPC ..... G03B 21/00–64; H04N 9/31–3197; H05K 7/2049
See application file for complete search history.

(56) References Cited

U.S. PATENT DOCUMENTS

2005/0001997 A1 1/2005 Kawaai et al.
2005/0237628 A1 10/2005 Shimizu
(Continued)

FOREIGN PATENT DOCUMENTS

CN 1410830 4/2003
CN 1474228 2/2004
(Continued)

OTHER PUBLICATIONS

"Office Action of China Counterpart Application", dated Mar. 1, 2021, p. 1-p. 8.
(Continued)

*Primary Examiner* — Michelle M Iacoletti
*Assistant Examiner* — Christopher A Lamb, II
(74) *Attorney, Agent, or Firm* — JCIPRNET

(57) ABSTRACT

An optical engine module comprises a casing, a light valve, a heat dissipating module, and at least three fixtures. The casing comprises at least three fixing structures. The light valve is disposed in the casing and is connected to the casing. The light valve comprises a heat interface. The heat dissipating module comprises a heat dissipating surface in contact with the heat interface of the light valve. The number of the at least three fixing structures and positions of the same correspond respectively to the number of the at least three fixtures and positions of the same. The heat dissipating module is connected to the casing by matching the at least three fixing structures and the at least three fixtures. In the optical engine module, improved stability of the heat dissipating module, preferable heat dissipating efficiency for the light valve, and thus good optical effect are provided.

19 Claims, 7 Drawing Sheets

(51) Int. Cl.
*G03B 21/00* (2006.01)
*H05K 7/20* (2006.01)

(56) References Cited

U.S. PATENT DOCUMENTS

| 2006/0033887 | A1  | 2/2006  | Wang |                |
|--------------|-----|---------|---------|-------------|
| 2006/0176453 | A1* | 8/2006  | Miyamoto | G03B 21/16 |
|              |     |         |         | 353/119     |
| 2017/0347070 | A1* | 11/2017 | Yamada   | G03B 21/145 |
| 2019/0179217 | A1* | 6/2019  | Tang     | G03B 21/16  |

FOREIGN PATENT DOCUMENTS

| CN | 101135836  | 3/2008  |
|----|------------|---------|
| CN | 101221347  | 7/2008  |
| CN | 101308318  | 11/2008 |
| CN | 102809879  | 12/2012 |
| CN | 106054508  | 10/2016 |
| CN | 209044286  | 6/2019  |
| CN | 209248236  | 8/2019  |
| JP | 2013225018 | 10/2013 |
| TW | 200817818  | 4/2008  |
| TW | 201702723  | 1/2017  |

OTHER PUBLICATIONS

"Office Action of China Related Application, application No. 201811364137.X", dated Mar. 1, 2021, p. 1-p. 7.
"Office Action of China Counterpart Application", dated Oct. 13, 2021, p. 1-p. 6.

* cited by examiner

OPTICAL ENGINE MODULE

CROSS-REFERENCE TO RELATED APPLICATION

This application claims the priority benefit of China application serial no. 201811364063.X, filed on Nov. 16, 2018. The entirety of the above-mentioned patent application is hereby incorporated by reference herein and makes a part of this specification.

BACKGROUND

Technical Field

The disclosure relates to an optical module, and more particularly to an optical engine module for a projection device.

Description of Related Art

The projection device is a display device for generating an image. During the image projection, an illumination beam generated by a light source may be converted into an image beam using a light valve, and the image beam may then be projected onto a screen or a wall using lenses. However, in optical engine modules, a heat dissipating device used for conducting heat from the light valve may be bolted onto the casing and it suffers from wobbling, resulting in a degrade in the imaging quality of the projection device. In addition, heat dissipating sheets may be disposed to conduct the heat caused from the light valve and accumulated in the optical engine module outside to the surrounding environment, while an increase in cost may be resulted due to the additionally configured heat dissipating sheets.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention were acknowledged by a person of ordinary skill in the art.

SUMMARY

The disclosure provides an optical engine module. In the optical engine module, improved stability of the heat dissipating module, preferable heat dissipating efficiency for the light valve, and thus good optical effect may be provided.

Other objectives and advantages of the disclosure can be further understood from the technical features disclosed herein.

In order to achieve one, part of, or all of the above objectives or other objectives, an embodiment of the disclosure provides an optical engine module, which comprises a casing, a light valve, a heat dissipating module, and at least three fixtures. The casing comprises at least three fixing structures. The light valve is disposed in the casing and is securely connected to the casing. The light valve comprises a heat interface. The heat dissipating module comprises a heat dissipating surface. The heat dissipating surface of the heat dissipating module is in contact with the heat interface of the light valve. The number of the at least three fixing structures and positions of the at least three fixing structures correspond respectively to the number of the at least three fixtures and positions of the at least three fixtures. The heat dissipating module is securely connected to the casing by matching the at least three fixing structures with the at least three fixtures.

Based on the above, embodiments of the disclosure have at least one of the following advantages or effects. In the optical engine module of the disclosure, the at least three fixtures are matched with the at least three fixing structures of the casing, so as to securely connect the heat dissipating module to the casing. The heat dissipating module can be prevented from wobbling, and therefore the stability may be improved, thereby improving the heat dissipating efficiency for the light valve and the optical effect effectively. In another optical engine module of the disclosure, a compensating module may be configured not only to support the optical compensating sheet required for the projection device, but also to achieve a heat dissipating and/or light shielding effect in the optical engine module. Therefore, the available space in the optical engine module may be expanded and the cost may be reduced.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
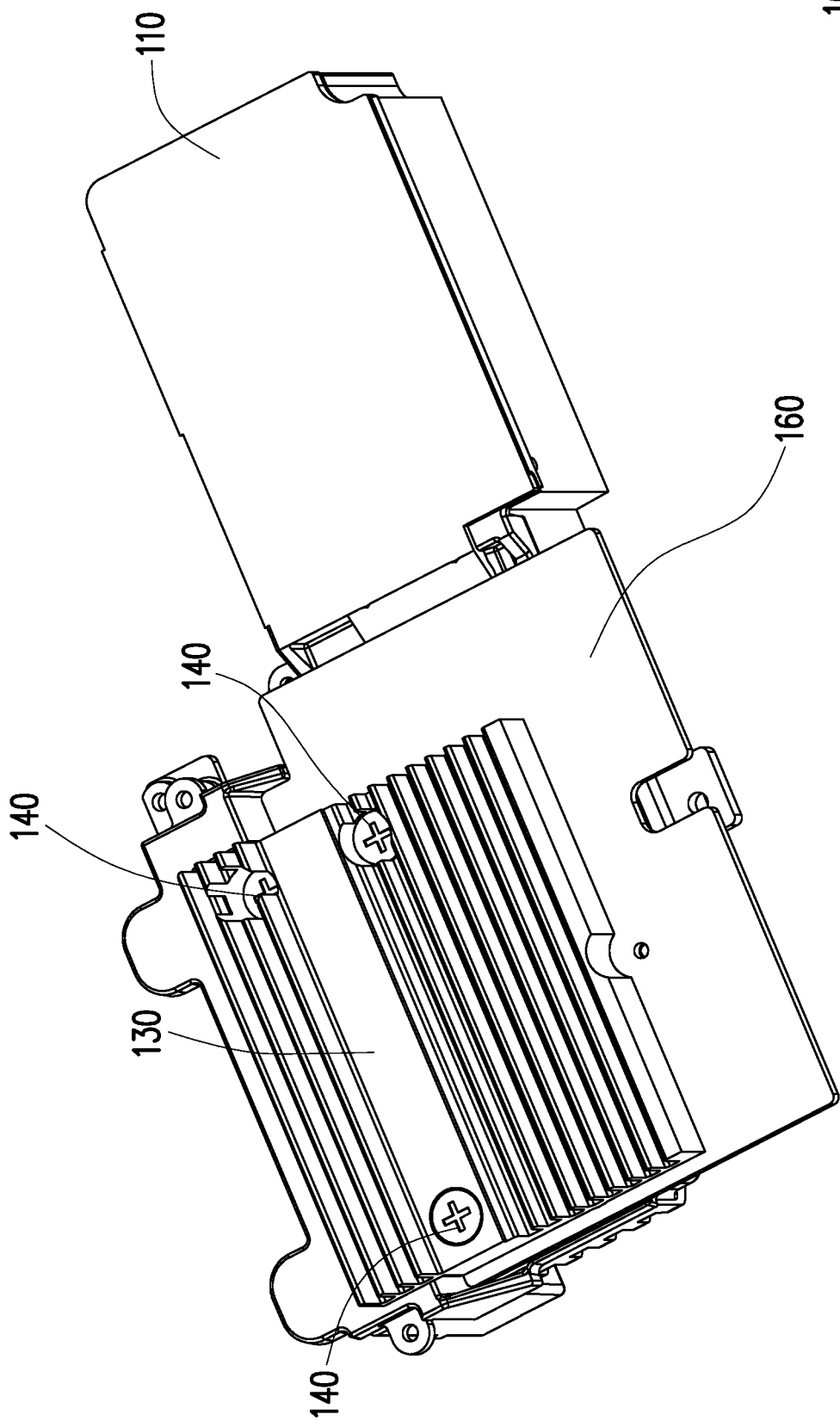
FIG. 1 is a perspective view of an optical engine module according to an embodiment of the disclosure.
Figure 2:
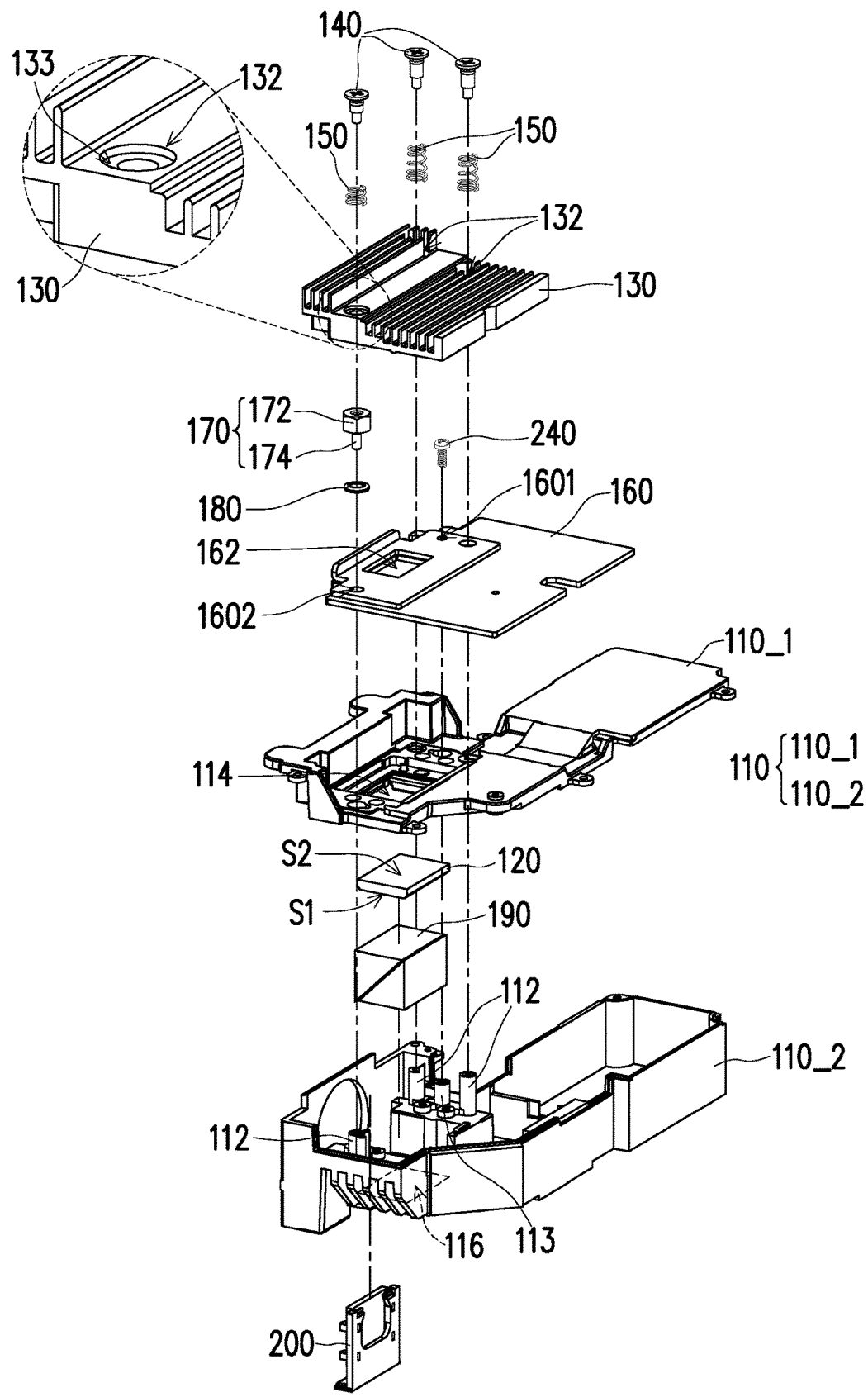
FIG. 2 is an exploded view of the optical engine module of FIG. 1.

FIG. 1 is a perspective view of an optical engine module according to an embodiment of the disclosure. FIG. 2 is an exploded view of the optical engine module of FIG. 1. Please refer to FIG. 1 and FIG. 2, this embodiment provides an optical engine module 100, which comprises a casing 110, a light valve 120, a heat dissipating module 130, at least three fixtures 140, and a compensating module 200. Specifically, in the embodiment, the optical engine module 100 further comprises a circuit board 160 and a light transmitting module 190. For example, the circuit board 160 can be a printed circuit board (PCB). The optical engine module 100 may be disposed in a projection device to convert an illumination beam provided from a light source of the projection device into an image beam and the image beam may be further projected onto a projection target (not shown), such as a screen or a wall. In the embodiment, a Reverse Total Internal Prism (RTIR) optical path structure may be configured in the optical engine module 100, but the disclosure is not limited thereto.

The light valve 120 is, for example, a reflective light modulator or a transmissive light modulator. Taking the reflective light modulator as an example, the light valve 120 is, for example, a liquid crystal on silicon panel (LCoS panel), a digital micro-mirror device (DMD), etc. In some embodiments, the light valve 120 may also be a transparent liquid crystal panel, an electro-optical modulator, a magneto-optic modulator, an acousto-optic modulator (AOM), or other transmissive light modulators. The light valve 120 comprises an active surface S1 and a heat interface S2. The active surface S1 comprises a plurality of movable reflective mirrors used for receiving the illumination beam and providing the image beam. The heat interface S2 is used for transferring heat to the surrounding environment. The circuit board 160 is electrically connected to the light valve 120 and is used for changing the states of the plurality of movable reflective mirrors of the light valve 120, such as from an activated state to a shut-off state, according to an electrical signal. The light transmitting module 190 is, for example, a prism group used for reflecting or refracting the image beam provided from the light valve 120 towards the projection lens. The disclosure does not limit the configuration and the type of the light valve 120, the circuit board 160, and the light transmitting module 190.

Figure 3:
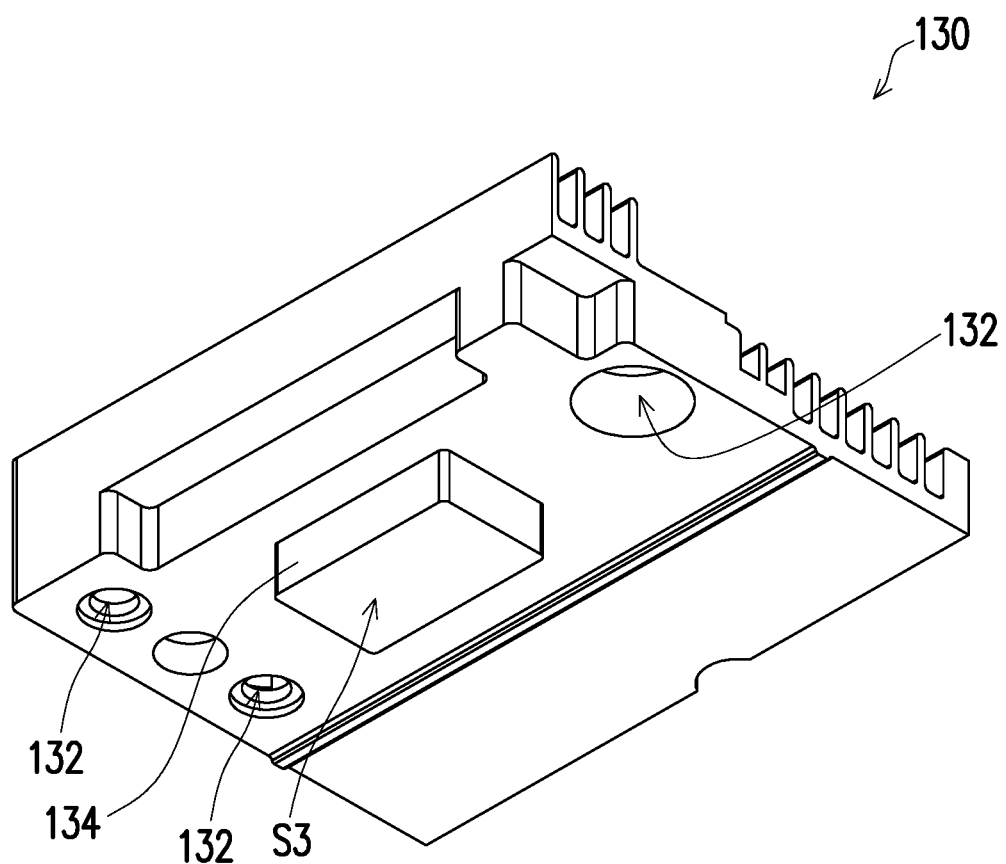
FIG. 3 is a perspective view of the heat dissipating module from another perspective in the optical engine module of FIG. 2.

In the embodiment, the light valve 120 and the light transmitting module 190 are disposed in the casing 110, and the circuit board 160 is disposed on the casing 110. Specifically, the casing 110 comprises an upper casing 110_1, a lower casing 110_2, and an opening 114. The light valve 120 is disposed in the upper casing 110_1 and is exposed from the opening 114 of the casing 110. The active surface S1 is used for providing a light beam (i.e. the image beam described-above). The light transmitting module 190 is located between the upper casing 110_1 and the lower casing 110_2. The circuit board 160 can be securely fixed onto the casing 110 by using, for example, one or more circuit board fixtures 240 (for example, screws). FIG. 3 is a perspective view of the heat dissipating module from another perspective in the optical engine module of FIG. 2. Please refer to FIG. 1 to FIG. 3 at the same time, the heat dissipating module 130 is disposed on the casing 110, and the circuit board 160 is located between the heat dissipating module 130 and the light valve 120. The heat dissipating module 130 comprises a heat dissipating surface S3 used for contacting the heat interface S2 of the light valve 120, so as to transfer the heat generated from the light valve 120 to the heat dissipating structure of the heat dissipating module 130. Specifically, in the embodiment, the heat dissipating module 130 comprises a protruding part 134 and the heat dissipating surface S3 is located at one end of the protruding part 134. In the embodiment, the protruding part 134 is square, but the disclosure is not limited thereto. The circuit board 160 comprises a perforation hole 162, and the protruding part 134 of the heat dissipating module 130 passes through the perforation hole 162 of the circuit board 160, such that the protruding part 134 may be in contact with the heat interface S2 of the light valve 120. Therefore, since the protruding part 134 of the heat dissipating module 130 directly contacts the light valve 120, the heat from the light valve 120 may be directly transferred to the surrounding environment.

Figure 4:
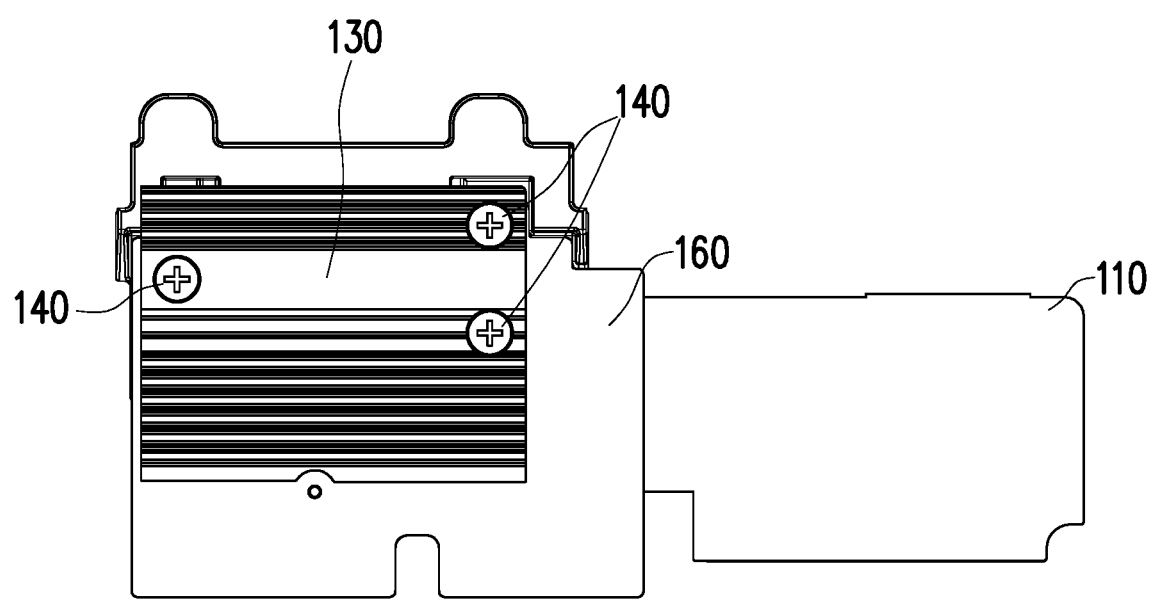
FIG. 4 is a top schematic view of the optical engine module of FIG. 1.

FIG. 4 is a top schematic view of the optical engine module of FIG. 1. Please refer to FIG. 1, FIG. 2, and FIG. 4 at the same time, the casing 110 further comprises at least three fixing structures 112. The number of the fixing structures 112 and positions of the same correspond respectively to the number of the fixtures 140 and the positions of the same. In other words, the fixing structure 112 and the fixture 140 are disposed in pairs. The number of the fixing structures 112 and that of the fixtures 140 may be three or more, and the following description will be exemplified using three, but the disclosure is not limited thereto. In the optical engine module 100, the heat dissipating module 130, the circuit board 160, and other elements may be securely connected to the casing 110 by matching the fixing structure 112 with the fixture 140. For example, the casing 110 may include at least one circuit board fixing structure 113, and at least one circuit board perforations 1601 and 1602 is disposed in the circuit board 160. For example, the circuit board fixture 240 can pass through the circuit board perforation 1601, so as to be connected to the circuit board fixing structure 113 of the casing 110, such that the circuit board 160 is fixed to the casing 110. Specifically, the circuit board fixing structure 113 may be a fixing column, and the fixing column is internally threaded. The circuit board fixture 240 may be, for example, a screw. The rod portion of the screw passes through the circuit board perforation 1601 of the circuit board, so as to be in threaded-connection with the circuit board fixing structure 113. However, the disclosure does not limit numbers of the circuit board fixing structure 113 and the circuit board fixture 240. In other embodiments, two or more circuit board fixing structures 113 and/or two or more circuit board fixtures 240 may be disposed, such that the circuit board may be uniformly stressed onto the casing and fixed to the casing by using the circuit board fixing structures 113 and the circuit board fixtures 240. For example, in an embodiment in which a casing comprises two circuit board fixing structures 113, the two circuit board fixing structures 113 are symmetrically arranged with respect to the perforation hole 162 on the circuit board, and the perforation hole 162 is the used for allowing the protruding part 134 of the heat dissipating module 130 to pass through. Therefore, the circuit board may be uniformly stressed and a warping may be avoided. The disclosure also does not limit the form of the circuit board fixing structure 113 or the circuit board fixture 240. In other embodiments, the circuit board fixing structure 113 and the circuit board fixture 240 used for fixing the circuit board 160 may be replaced or partially replaced with other fixing structures and/or fixtures. For example, in other embodiments, the circuit board fixture 240 can be replaced with an adapter 170 (described in detail below).

Specifically, in the embodiment, at least one of the fixing structures 112 is a fixing column, and the fixing column is internally threaded. The following description will be exemplified using three fixing columns. The heat dissipating module 130 comprises perforations 132, the number of which corresponds to the number of fixing structures 112. The perforations 132 allows the fixtures 140 to pass through respectively and further are securely connected to the fixing structures 112, that is, the fixtures 140 are disposed to be in match with the fixing structures 112. Therefore, when the casing 110 is securely connected with the fixture 140, the horizontal positions of the heat dissipating module 130 and the circuit board 160 relative to the casing 11 may be restricted properly by the columnar configuration of the fixing structure 112. Thus, a more stable overall structure may be achieved. In other embodiments, the fixing structure 112 may be a fixing perforation, and the fixing perforation is internally threaded, such that the fixtures 140 may pass through the heat dissipating module 130 and the circuit board 160, so as to be in threaded-connection with the fixing structure 112, that is, the fixtures 140 are disposed to be in match with the fixing structures 112. However, the disclosure does not limit the matching method between the fixture 140 and the fixing structure 112, and they may be directly connected or indirectly connected, by using other elements for example.

In the embodiment, the fixture 140 is, for example, a step screw. In other embodiments, a general screw or other types of screws may also be used, and the disclosure is not limited thereto. In the embodiment, on a plane parallel to the heat interface S2 of the light valve 120, a plurality of fixtures 140 forms a triangle or other polygons. For example, three fixtures 140 may not form a line on the plane parallel to the heat interface S2. In this way, the heat dissipating module 130 can be prevented from wobbling, and stability of the heat dissipating module 130 may be improved, thereby improving the heat dissipating efficiency for the light valve 120 and the optical effect effectively.

In addition, in the embodiment, the optical engine module 100 further comprises at least three spring sets 150. For example, three spring sets 150 are respectively connected between the fixture 140 and the fixing structure 112 of the casing 110. Specifically, three spring sets 150 in the embodiment may be sleeved onto the fixture 140, and more specifically, the three spring sets 150 may be sleeved onto a step portion of the step screw. Additionally or alternatively, the perforation 132 of the heat dissipating module 130 may include a spring bearing surface 133. When the spring set 150 is sleeved onto the fixture 140 so as to fix the heat dissipating module 130 onto the casing, the spring set 150 abuts the spring bearing surface 133 of the perforation 132. In this way, a buffer space may be provided between the heat dissipating module 130 and the casing 110, so as to accommodate the tolerance generated when the heat dissipating module 130 is fixed to the casing 110. In the embodiment, the spring set 150 is, for example, a helical compression spring, but in other embodiments, a disc spring or a combination of the two may also be selected, and the disclosure is not limited thereto.

In the embodiment, the optical engine module 100 may further include at least one adapter 170. For example, one adapter 170 may be securely connected between one of the fixtures 140 and one of the fixing structures 112. Specifically, one fixing structure 112 of the casing 110 is securely connected to a corresponding fixture 140 by using an adapter 170. In other words, in the embodiment, the lengths of the three fixing structures 112 of the casing 110 may be identical or different from one another. The adapter 170 comprises an internally-threaded part 172 and an externally-threaded rod part 174 (the externally-threaded rod part 174 illustrated in FIG. 2 is for illustrative purpose only). The internally-threaded part 172 is used to be securely connected with one of the fixtures 140, and the externally-threaded rod part 174 is used to be securely connected with one of the fixing structures 112 of the casing 110. In the embodiment, the internally-threaded part 172 and the externally-threaded rod part 174 are integrally formed. For example, the internally-threaded part 172 and the externally-threaded rod part 174 may be formed into an adapter screw, but the disclosure is not limited thereto. Therefore, by the matching of the adapter 170 with the fixing structure 112, the fixture 140 may be used to further enhance the stability of the heat dissipating module 130 and the circuit board 160. At the same time, the distance between the heat dissipating module 130 and the circuit board 160 can be changed by changing the height of the adapter 170, thereby providing good heat dissipating effect. Additionally or alternatively, the adapter 170 may also be used to assist in fixing the circuit board 160. For example, the externally-threaded rod part 174 of the adapter 170 can pass through the circuit board perforation 1602 of the circuit board 160, so as to be in threaded-connection with one of the fixing structures 112. Under such circumstance, the fixing structure 112 connected to the adapter 170 and the circuit board fixing structure 113 described-above are positioned to be at two opposite sides of the perforation hole 162 of the circuit board 160 and to be symmetrically arranged, so as to facilitate stability of the circuit board and achieve a uniform stress distribution on the casing 110.

In addition, the optical engine module 100 may also include at least one auxiliary element 180 sleeved onto an adapter 170 and located between the adapter 170 and a fixing structure 112, for example. In the embodiment, the auxiliary element 180 may be an elastic member such as a disc spring, but in other embodiments, a helical compression spring similar to the spring set 150 may also be used, and the disclosure is not limited thereto. In this way, the elastic force generated from the connection of the fixture 140, the adapter 170, the auxiliary element 180, and the fixing structure 112 is approximately equal to two times the elastic force generated from the connection of directly connecting other fixture 140 and the fixing structure 112. For example, when assembly is completed, the pressure applied to the light valve 120 may not exceed 12 kg (117N). Therefore, a buffer space may be further provided between the heat dissipating module 130 and the casing 110, so as to accommodate the tolerance generated when the heat dissipating module 130 is fixed to the casing 110.

In the embodiment, in the case where the adapter 170 and the auxiliary element 180 are disposed between the fixture 140 and the fixing structure 112, the fixing structure 112 may be designed as a fixing column with a lower height. In other words, the heights of the fixing structures 112 may be identical or different from one another. Alternatively, in the case where the adapter 170 and the auxiliary element 180 are disposed between the fixture 140 and the fixing structure 112, the fixture 140 may be designed as a screw or a step screw with a shorter length, so as to achieve a stable match with the casing, but the disclosure is not limited thereto.

Figure 5:
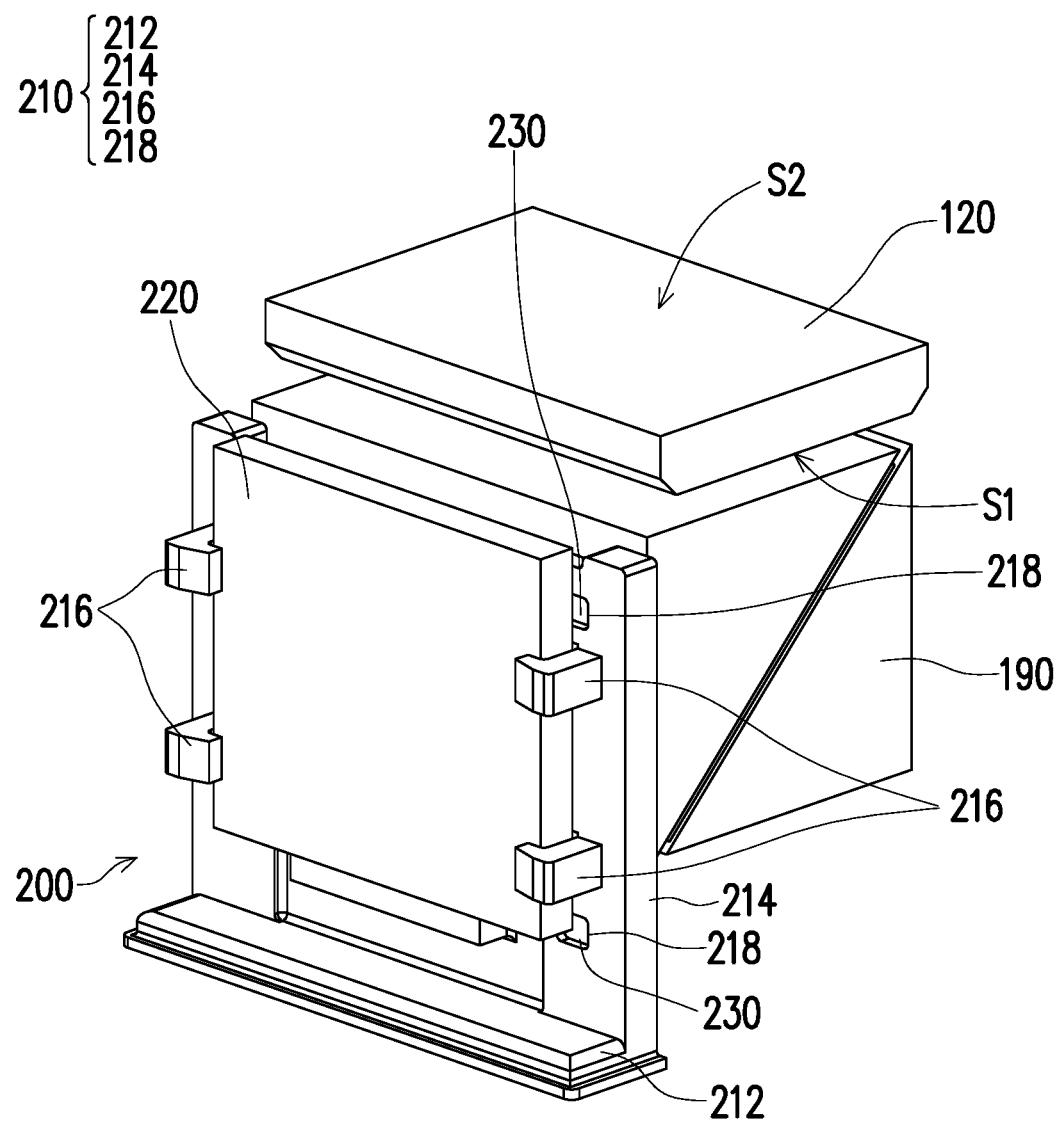
FIG. 5 is a perspective view of a partial structure in the optical engine module of FIG. 2.

FIG. 5 is a perspective view of a partial structure in the optical engine module of FIG. 2. Please refer to FIG. 1, FIG. 2, and FIG. 5, in the embodiment, the compensating module 200 is disposed on the casing 110 and can be inserted into the casing 110 from a notch 116 of the casing 110, so as to complete the assembly. Specifically, the compensating module 200 comprises an optical compensating element 220 and a heat dissipating support 210. The heat dissipating support 210 is located between the light valve 120 and the optical compensating element 220. The optical compensating element 220 is, for example, a B270 optical compensating sheet, and is located on the transmission path of the light beam. The optical compensating element 220 may be used to compensate for the optical path difference of the light beam. The heat dissipating support 210 is used for holding the optical compensating element 220. The light transmitting module 190 is located between the light valve 120 and the optical compensating element 220 of the compensating module 200.

The active surface S1 of the light valve 120 can be controlled by an electrical signal and therefore may be switched into different states. In the description hereinafter, a first state is defined as a state in which, for example, a part of the movable reflective mirrors included in the light valve 120 is activated. Under this state, the part of the movable reflective mirrors converts an illumination bean in the optical engine module 100 into an image beam, and the image beam may then be transmitted to a projection lens. A second state is defined as a state in which, for example, a part of the movable reflective mirrors included in the light valve 120 is shut off. Under this state, the part of the movable reflective mirrors may not transmit the image beam to the projection lens. In the embodiment, when some of the reflective mirrors in the light valve 120 are in the first state, the light beam is transmitted to and passes through the optical compensating element 220. When the other reflective mirrors in the light valve 120 is in the second state, the light beam may be transmitted to the heat dissipating support 210. Therefore, heat can be conducted to the heat dissipating support 210 for dissipating. In other words, in the embodiment, the compensating module 200 may be configured not only to support the optical compensating sheet required for the projection device, but also to achieve a heat dissipating and/or light shielding effect in the optical engine module 100. Therefore, the available space in the optical engine module 100 may be expanded, and/or the cost may be reduced.

Specifically, in the embodiment, the cross-section of the heat dissipating support 210 is L-shaped and the heat dissipating support 210 may include a heat dissipating part 212 and a support part 214. The heat dissipating part 212 can be fixed onto the casing 110. The support part 214 can be used for holding the optical compensating element 220 and the support part 214 can pass through the notch 116 on the casing 110, so that the optical compensating element 220 supported by the heat dissipating support 210 is located on the transmission path of the light beam. In a configuration including a RTIR optical path structure for example, the support part 214 of the heat dissipating support 210 and the light valve 120 are respectively located on two adjacent sides of the light transmitting module 190, but the disclosure is not limited thereto. In the embodiment, the heat dissipating part 212 and the support part 214 are integrally formed, but in other embodiments, the heat dissipating part 212 and the support part 214 may be independent elements, which can be assembled to constitute the heat dissipating support 210.

In the embodiment, the heat dissipating support 210 further comprises a plurality of clamp structures 216 used for clamping the optical compensating element 220. In addition, in the embodiment, the heat dissipating support 210 may further include a plurality of grooves 218, and the compensating module 200 may further include adhesives 230. The adhesives 230 can be filled in the grooves 218. In the embodiment, the adhesive 230 may be an ultraviolet (UV) glue, but the disclosure is not limited thereto. Therefore, the optical compensating element 220 may be restricted in position on the heat dissipating support 210 by using the clamp structure 216 and further adhered to the heat dissipating support 210 by using the adhesive 230. In this way, the stability of the compensating module 200 can be further improved. Thus, good optical effect may be provided by the optical engine module 100. The disclosure does not limit the number and position of the plurality of clamp structures 216 (for example, 2 to 4 or more). The plurality of clamp structures 216 may be symmetrically or asymmetrically disposed with respect to the clamped optical compensating element 220.

Figure 6:
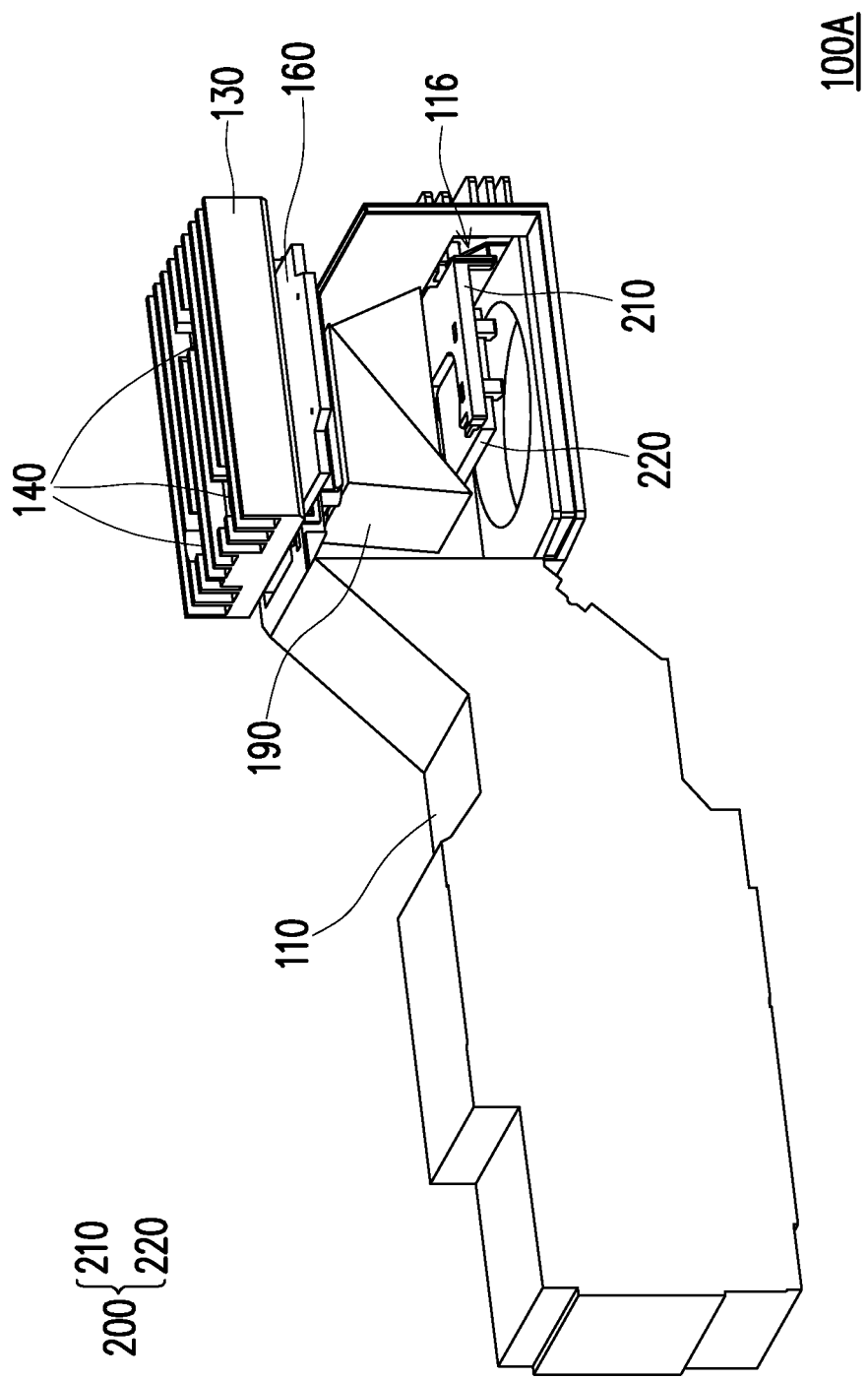
FIG. 6 is a perspective view of an optical engine module according to another embodiment of the disclosure.
Figure 7:
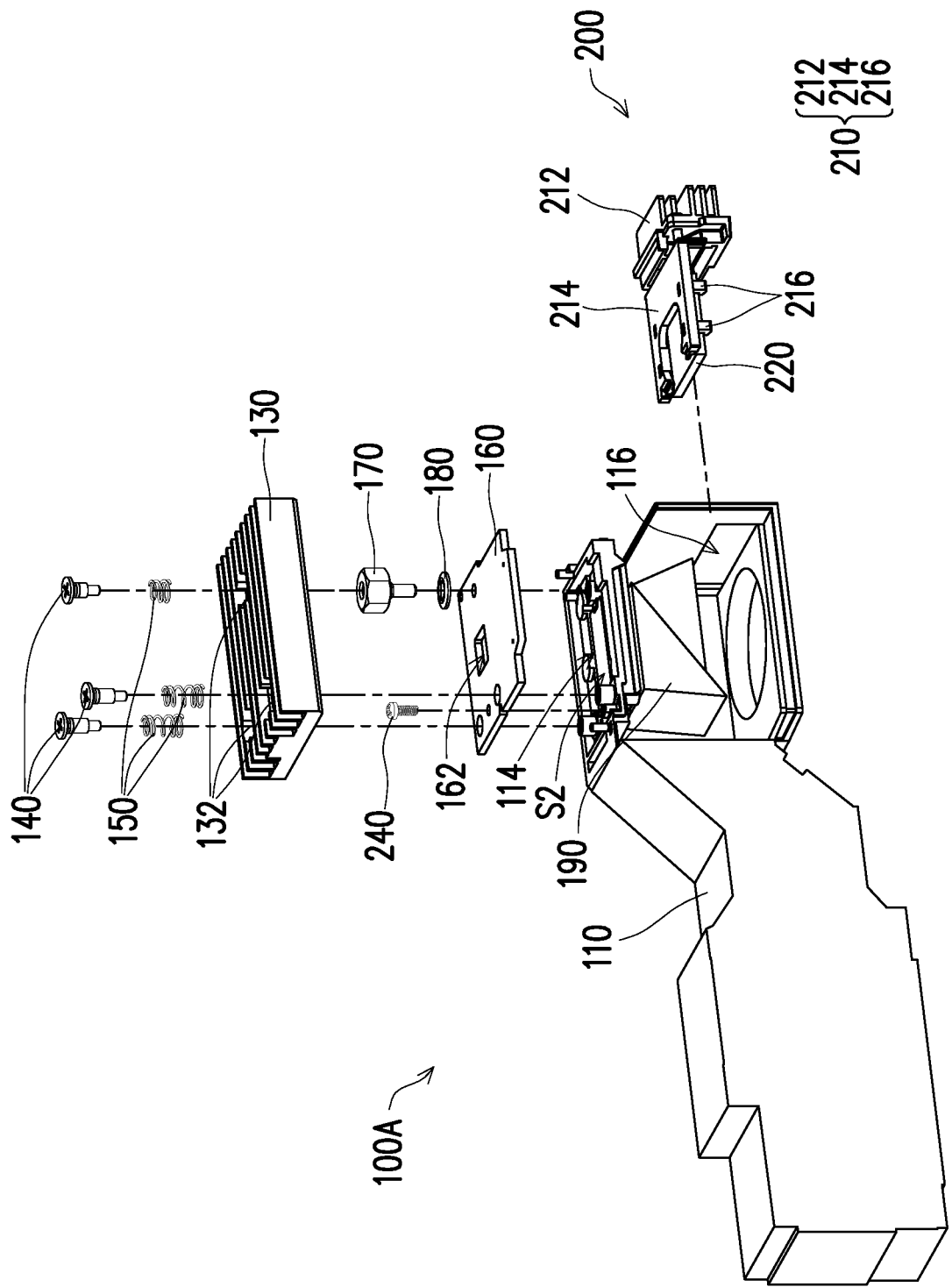
FIG. 7 is an exploded view of the optical engine module of FIG. 6.

FIG. 6 is a perspective view of an optical engine module according to another embodiment of the disclosure. FIG. 7 is an exploded view of the optical engine module of FIG. 6. Please refer to FIG. 6 and FIG. 7, an optical engine module 100A of the embodiment is similar to the optical engine module 100 of FIG. 1. The difference between the two is that in the present embodiment, the optical engine module 100A includes a TIR optical path structure. In this embodiment, the support part 214 of the heat dissipating support 210 in the compensating module 200 and the light valve 120 (not shown) are respectively located on opposite sides of the light transmitting module 190. Therefore, in the embodiment, when some of the reflective mirrors in the light valve 120 are in the first state, the light beam is transmitted through the optical compensating element 220. When the other of the reflective mirrors in the light valve 120 is in the second state, the light beam is transmitted to the heat dissipating support 210 along a lateral direction. In this way, the compensating module 200 may be configured not only to support the optical compensating sheet required for the projection device, but also to achieve a heat dissipating and/or light shielding effect in the optical engine module 100. Therefore, the available space in the optical engine module 100 may be further expanded, and/or the cost may be reduced.

Based on the above, the embodiments of the disclosure have at least one of the following advantages or effects. In the optical engine module of the disclosure, the at least three fixtures are matched with the at least three fixing structures of the casing, so as to securely connect the heat dissipating module to the casing. The heat dissipating module can be prevented from wobbling, and therefore the stability may be improved, thereby improving the heat dissipating efficiency for the light valve and the optical effect effectively.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An optical engine module, comprising a casing, a light valve, a heat dissipating module, and at least three fixtures, wherein:
    the casing comprises at least three fixing structures,
    the light valve is disposed in the casing and is connected to the casing, wherein the light valve comprises a heat interface,
    the heat dissipating module comprises a heat dissipating surface, wherein the heat dissipating surface of the heat dissipating module is in contact with the heat interface of the light valve,
    a number of the at least three fixing structures and positions of the at least three fixing structures correspond respectively to a number the at least three fixtures and positions of the at least three fixtures,
    the heat dissipating module is connected to the casing by matching the at least three fixing structures with the at least three fixtures; and
    the optical engine module further comprises at least one adapter, wherein the at least one adapter is connected between one of the at least three fixtures and one of the at least three fixing structures, and at least another one of the at least three fixing structures is directly connected to at least another one of the at least three fixtures.

2. The optical engine module according to claim 1, wherein the number of the at least three fixtures is three.

3. The optical engine module according to claim 1, wherein on a plane parallel to the heat interface of the light valve, the at least three fixtures form a triangle or another polygon.

4. The optical engine module of claim 1, wherein the heat dissipating module comprises at least three perforations, and the at least three fixtures or the at least three fixing structures respectively passes through the at least three perforations.

5. The optical engine module according to claim 4, wherein at least one of the at least three fixing structures of the casing is a fixing column and the fixing column is internally threaded, and wherein at least one of the at least three fixtures is connected to the fixing column by passing through at least one of the at least three perforations of the heat dissipating module.

6. The optical engine module according to claim 5, wherein a number of the fixing column is plural and heights of a plurality of fixing columns are identical or different from one another.

7. The optical engine module according to claim 1, further comprising:
    at least three spring sets, the at least three spring sets are respectively connected between the at least three fixtures and the at least three fixing structures.

8. The optical engine module according to claim 7, wherein the at least three spring sets include helical compression springs, disc springs, and combinations thereof.

9. The optical engine module according to claim 1, further comprising:
    a circuit board, wherein the circuit board is disposed between the light valve and the heat dissipating module and is connected to the casing.

10. The optical engine module according to claim 9, wherein the heat dissipating module comprises a protruding part, the heat dissipating surface of the heat dissipating module is located at an end of the protruding part, the circuit board comprises a perforation hole, and the protruding pat of the heat dissipating module passes through the perforation hole of the circuit board to be in contact with the heat interface of the light valve.

11. The optical engine module according to claim 10, wherein the casing further comprises at least one circuit board fixing structure, at least one circuit board perforation is disposed in the circuit board, and the optical engine module further comprises at least one circuit board fixture, wherein the at least one circuit board fixture passes through the at least one circuit board perforation to be locked to the at least one circuit board fixing structure of the casing, so as to fix the circuit board between the light valve and the heat dissipating module.

12. The optical engine module according to claim 11, wherein the at least one circuit board fixing structure comprises a fixing column, and the fixing column is internally threaded, the at least one circuit board fixture comprises a screw.

13. The optical engine module according to claim 11, wherein the optical engine module further comprises at least one adapter connected between at least one of the at least three fixtures and at least one of the at least three fixing structures, wherein the at least one adapter passes through the at least one circuit board perforation, so as to be connected with the at least one of the at least three fixing structures, such that the circuit board is fixed between the light valve and the heat dissipating module.

14. The optical engine module according to claim 13, wherein the at least one adapter and the at least one circuit board fixture are positioned to be at two opposite sides of the perforation hole of the circuit board and to be symmetrically arranged.

15. The optical engine module according to claim 1, further comprising:
   at least one auxiliary element, wherein the at least one auxiliary element is sleeved onto the at least one adapter and is located between the at least one adapter and one of the at least three fixing structures.

16. The optical engine module according to claim 1, wherein the at least one adapter comprises an adapter screw, the at least one adapter comprises an internally-threaded part and an externally-threaded rod part, the internally-threaded part securely connects with the at least three fixtures, and the externally-threaded rod part securely connects with the at least three fixing structures of the casing.

17. The optical engine module according to claim 16, wherein the internally-threaded part and the externally-threaded rod part are integrally formed.

18. The optical engine module according to claim 1, wherein lengths of the at least three fixtures are identical or different from one another.

19. The optical engine module according to claim 1, wherein a pressure applied to the light valve is lower than 12 kg (117N).

* * * * *